United States Patent
Lin et al.

(10) Patent No.: US 10,008,463 B2
(45) Date of Patent: Jun. 26, 2018

(54) WAFER-LEVEL PACKAGING MECHANISMS

(71) Applicant: TAIWAN SEMICONDUCTOR MANUFACTURING COMPANY, LTD., Hsinchu (TW)

(72) Inventors: Jing-Cheng Lin, Chu Tung Zhen (TW); Jui-Pin Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 36 days.

(21) Appl. No.: 14/211,341

(22) Filed: Mar. 14, 2014

(65) Prior Publication Data
US 2014/0197535 A1  Jul. 17, 2014

Related U.S. Application Data

(62) Division of application No. 13/539,229, filed on Jun. 29, 2012, now Pat. No. 8,703,542.

(Continued)

(51) Int. Cl.
*H01L 23/00* (2006.01)
*H01L 23/538* (2006.01)
(Continued)

(52) U.S. Cl.
CPC .......... *H01L 24/10* (2013.01); *H01L 21/568* (2013.01); *H01L 23/49822* (2013.01);
(Continued)

(58) Field of Classification Search
CPC ....... H01L 24/10; H01L 21/568; H01L 24/82; H01L 24/20; H01L 23/5389;
(Continued)

(56) References Cited

U.S. PATENT DOCUMENTS 5,353,498 A * 10/1994 Fillion ................. H01L 21/568
257/E21.505
7,238,602 B2 * 7/2007 Yang ................. H01L 23/49816
257/E23.069
(Continued)

FOREIGN PATENT DOCUMENTS

CN             102347251         2/2012

OTHER PUBLICATIONS

Office Action dated Aug. 6, 2014 from corresponding application No. DE 10 2012 112 758.1.

*Primary Examiner* — David Vu
(74) *Attorney, Agent, or Firm* — Eschweiler & Potashnik, LLC

(57) ABSTRACT

A semiconductor package includes a first semiconductor die surrounded by a molding compound. The semiconductor package further includes a first conductive pad on the first semiconductor die, wherein the first conductive pad is at a top metal level of the first semiconductor die. The semiconductor package further includes redistribution lines (RDLs) formed over the first conductive pad, wherein at least one RDL of the RDLs extends beyond the boundaries of the semiconductor die, and a portion of the at least one RDL contacts the first conductive pad, wherein a surface of the first conductive pad contacting the portion of the at least one RDL is at a different level than a surface of the molding compound under the at least one RDL extended beyond the boundaries of the first semiconductor die.

20 Claims, 12 Drawing Sheets

Related U.S. Application Data

(60) Provisional application No. 61/649,174, filed on May 18, 2012.

(51) Int. Cl.
*H01L 21/56* (2006.01)
*H01L 23/498* (2006.01)

(52) U.S. Cl.
CPC .......... *H01L 23/5389* (2013.01); *H01L 24/19* (2013.01); *H01L 24/20* (2013.01); *H01L 24/24* (2013.01); *H01L 24/82* (2013.01); *H01L 23/49816* (2013.01); *H01L 2224/0401* (2013.01); *H01L 2224/04105* (2013.01); *H01L 2224/12105* (2013.01); *H01L 2224/131* (2013.01); *H01L 2224/13147* (2013.01); *H01L 2224/24137* (2013.01); *H01L 2224/82001* (2013.01); *H01L 2924/181* (2013.01); *H01L 2924/18162* (2013.01)

(58) Field of Classification Search
CPC ... H01L 23/49822; H01L 24/24; H01L 24/19; H01L 2924/181; H01L 2224/0401; H01L 2224/04105; H01L 2224/12105; H01L 2924/18162; H01L 2224/82001; H01L 23/49816
USPC ........ 438/106, 109, 126, 127, 118; 257/686, 257/687, 678, 700, E23.001, E23.003, 257/E23.011
See application file for complete search history.

(56) References Cited

U.S. PATENT DOCUMENTS

| | | | |
|---|---|---|---|
| 7,276,783 B2* | 10/2007 | Goller | H01L 21/56 257/678 |
| 7,863,090 B2* | 1/2011 | Eichelberger | H01L 21/6835 257/678 |
| 8,034,661 B2* | 10/2011 | Lin | H01L 21/568 257/E21.503 |
| 8,039,303 B2* | 10/2011 | Shim | H01L 21/568 257/100 |
| 8,294,253 B2* | 10/2012 | Ihara | H01L 21/486 257/686 |
| 8,361,842 B2 | 1/2013 | Yu et al. | |
| 2002/0028045 A1 | 3/2002 | Yoshimura et al. | |
| 2004/0232543 A1 | 11/2004 | Goller et al. | |
| 2007/0096306 A1* | 5/2007 | Yamagata | H01L 23/5389 257/734 |
| 2011/0024887 A1* | 2/2011 | Chi | H01L 21/568 257/684 |
| 2011/0204513 A1 | 8/2011 | Meyer et al. | |
| 2011/0241222 A1 | 10/2011 | Sezi et al. | |

\* cited by examiner

WAFER-LEVEL PACKAGING MECHANISMS

PRIORITY CLAIM

The present application is a divisional of U.S. application Ser. No. 13/539,229, filed Jun. 29, 2012, which claims the priority of U.S. Provisional Application No. 61/649,174, filed May 18, 2012, both of which are incorporated by reference herein in their entireties.

RELATED APPLICATIONS

This application relates to the following co-pending and commonly assigned patent applications: Ser. No. 12/880,736, entitled "Embedded Wafer-Level Bonding Approaches" and filed on Sep. 13, 2010, and Ser. No. 13/452,140, entitled "Multi-Chip Fan Out Package and Methods of Forming the Same" and filed on Apr. 20, 2012, both of which are incorporated herein in their entireties.

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is decreased, solder bridging may occur. Additionally, under the fixed ball-size requirement, solder balls must have a predetermined size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means that the I/O pads on a die can be redistributed to a greater area than that of the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A novel embedded wafer-level package structure and methods of forming the same are provided in accordance with one or more embodiments. The intermediate stages of manufacturing the package structure in accordance with the one or more embodiments are illustrated. Variations of the one or more embodiments are also discussed. Throughout the various views and illustrative embodiments, like reference numbers are used to designate like elements.

Figure 1:
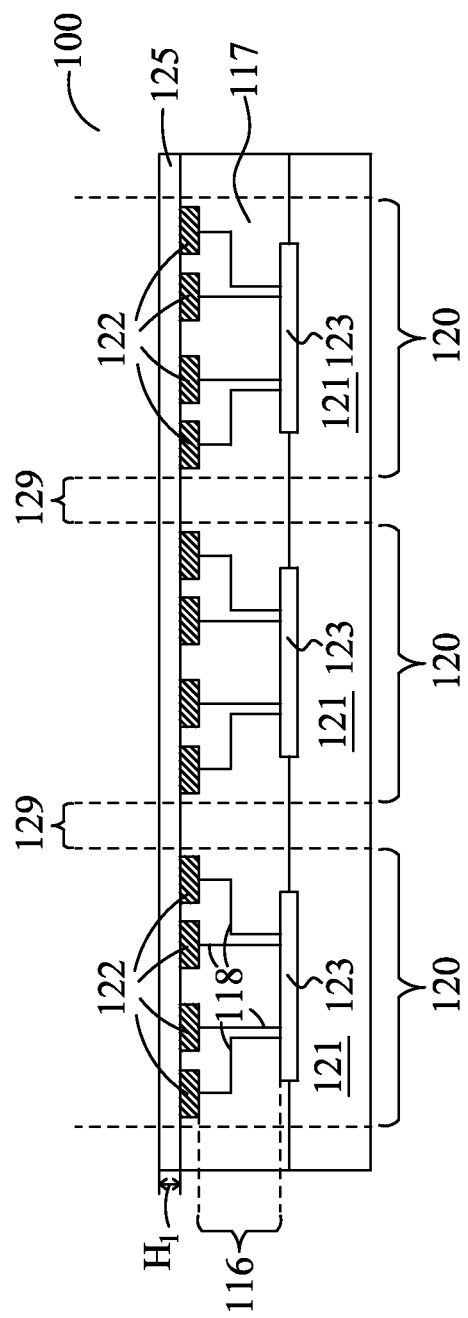
FIGS. 1 through 10 are cross-sectional views of a wafer-level package at various manufacturing stages in accordance with various embodiments.

FIG. 1 illustrates a cross-sectional view of dies 120 in accordance with some exemplary embodiments. Wafer 100 includes a plurality of dies 120 (also referred to as chips). Furthermore, wafer 100 (and dies 120 therein) may include a semiconductor substrate 121, and may include integrated circuit devices 123 and the overlying interconnect structure 116. Integrated circuit devices 123 may include active devices such as transistors. In some exemplary embodiments, interconnect structure 116 includes metal lines and vias 118 formed in dielectric layers 117. Dielectric layers 117 may include low dielectric constant (low-k) dielectric layers, for example, with dielectric constant values (k values) lower than about 3.0, and passivation layers over the low-k dielectric layers. Conductive pads 122 are formed at a top surface of dies 120, and are electrically coupled to integrated circuit devices 123 through interconnect structure 116. In some embodiments, conductive pads 122 are bond pads. Conductive pads 122 may comprise metals such as aluminum, copper, nickel, gold, or combinations thereof.

A planarization stop layer 125 is formed over the top surface of dies 120 and covers conductive pads 122, as shown in FIG. 1. The planarization stop layer 125 protects dies 120 during a planarization operation, which will be described below. In some embodiments, the thickness $H_1$ of planarization stop layer 125 is in a range from about 5 μm to about 100 μm.

Wafer 100 is sawed along scribe lines 129, so that dies 120 are separated from each other. Alignment marks (not shown) may be formed adjacent to the top surface of dies 120, and are visible from top.

Figure 2:
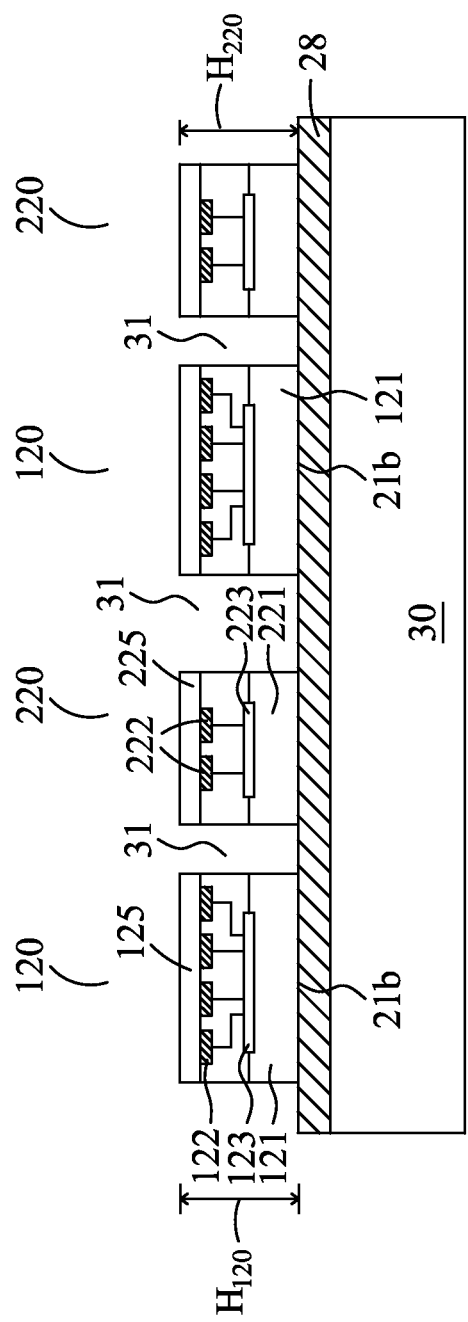

Referring to FIG. 2, adhesive layer 28 is disposed, for example, laminated, on carrier 30. Adhesive layer 28 may be formed of a glue, or may be a lamination layer formed of a foil. Dies 120 are then placed on carrier 30 and adhered to adhesive layer 28. In the embodiments wherein dies 120 include corresponding portions of the semiconductor substrate 121, the bottom surfaces 21b of semiconductor substrate 121 contact adhesive layer 28. Carrier 30 may include alignment marks (not shown), so that dies 120 are accurately mounted on desirable positions of carrier 30. Prior to mounting dies 120 on carrier 30, dies 120 can be tested to determine which dies are bad. Only good dies are mounted on carrier 30.

FIG. 2 also illustrates the placement of dies 220 on adhesive layer 28, wherein dies 220 may be identical to each other. Dies 220 are also tested prior to being mounted on carrier 30 to make sure that only good dies are mounted on carrier 30. In accordance with some embodiments, dies 220 are device dies, which may include active devices such as transistors 223 at the surfaces of the respective semiconductor substrates 221. In some embodiments, conductive pads 222 are formed on the top surfaces of dies 220. Conductive pads 222 may comprise gold, aluminum, copper, nickel, or combinations thereof. Similar to dies 120, the top surface of dies 220 are also covered by a planarization stop layer 225. Dies 220 may have a structure different from that of dies 120, wherein the difference in the structure may include the difference in the circuits formed therein, the difference in the top-view sizes, the difference in the heights, and the like. In some embodiments, dies 220 may be formed from a wafer that has a different size than wafer 100 (FIG. 1). Spaces 31 are left between neighboring dies 120 and 220. When viewed from top, spaces 31 may form a grid that encircles each of dies 120 and 220.

Figure 3:
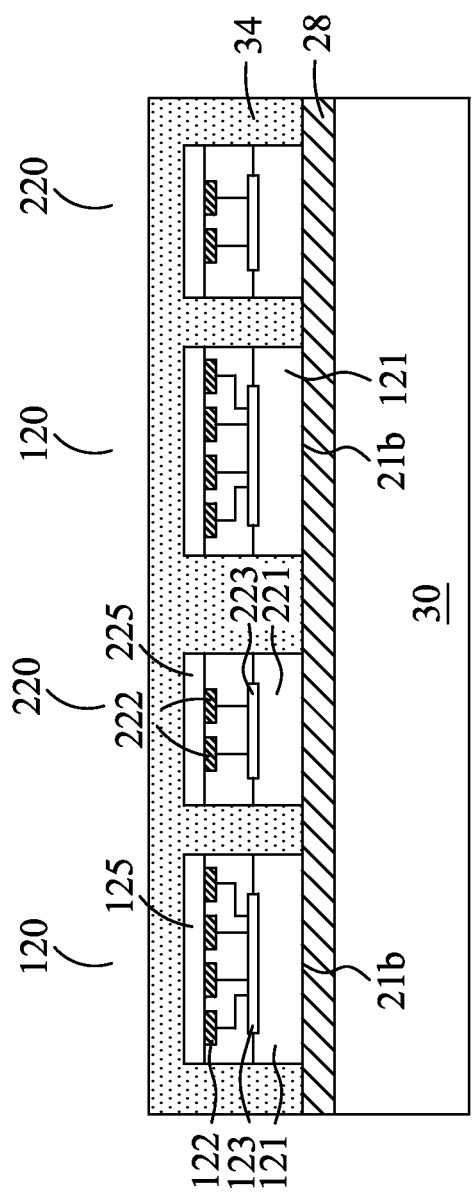

After dies 120 and 220 are placed on carrier 20, polymer 34 is filled into the spaces between dies 120 and 220, as shown in FIG. 3 in accordance with some embodiments. In some exemplary embodiments, polymer 34 is a molding compound, and hence is referred to as molding compound 34 hereinafter, although it may be a material other than molding compound. For example, polymer 34 may be formed of other dielectric materials such as a molding underfill, an epoxy, or the like. A curing process is then performed to solidify molding compound 34.

Figure 4:
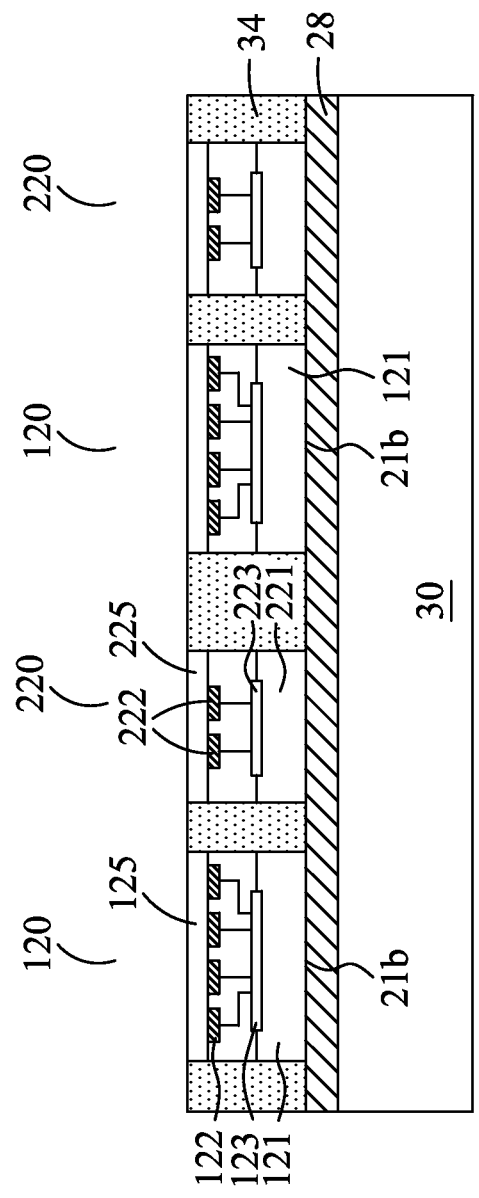

Referring to FIG. 4, a planarization such as a grinding operation is performed on molding compound 34, until planarization stop layers 125 and 225 are exposed. Accordingly, the top surface 125a of planarization stop layer 125 and top surface 225a of planarization stop layer 225 may be substantially level with each other, and may be substantially flat. The planarization stop layers 125 and 225 are fluidic in the form, such as a paste or a glue, in some embodiments. In some embodiments, the fluidic planarization stop layers 125 and/or 225 are deposited by spin-coating. In some embodiments, the planarization stop layers 125 and 225 are solid. The solid planarization stop layers 125 and/or 225 are formed by deposition processes, such as chemical vapor deposition (CVD), in some embodiments.

The hardness of the planarization stop layers 125 and 225 could be significantly lower than the hardness of molding compound 34. For example, the Young's modulus (a measurement of hardness) of molding compound 34 could be in a range from about 10 to about 30 GPa and the Young's modulus of planarization stop layers 125 and 225 are less than about 5 GPa. In some embodiments, the Young's modulus of planarization stop layers 125 and 225 are less than about 0.1 GPa. During planarization of molding compound 34, when one or both of planarization stop layers 125 and 225 is reached, the resistance sensed by the planarization tool, such as a grinder, would be different due to the difference in Young's modulus (reflecting hardness) of layers 125 and/or 225, and molding compound 34. The difference resistance experienced by the planarization tool can be used to determine an endpoint of the planarization process.

During the planarization process, the removal rates of planarization stop layers 125 and/or 225 is substantially lower than the removal rate of molding compound 34, in some embodiments. In some embodiments, the ratio of removal rate of molding compound 34 to planarization stop layer 125 or 225 is equal to or greater than about 1.3. In some embodiments, the ratio is equal to or greater than about 2. In some embodiments, the ratio is equal to or greater than about 3. The difference in planarization rates of molding compound 34 and planarization stop layers 125 and/or 225 helps the determination of the endpoint of the planarization process.

In some embodiments, the planarization stop layers 125 and 225 are made of polymers, such as epoxy, or the like. In some embodiments, the thickness of planarization stop layer 125 or 225 is in a range from about 5 μm to about 100 μm. In some embodiments, the total thickness $H_{120}$ (FIG. 2) of die 120 with planarization stop layer 125 and the total thickness $H_{220}$ (FIG. 2) of die 220 with planarization stop layer 225 are substantially the same.

Figure 5:
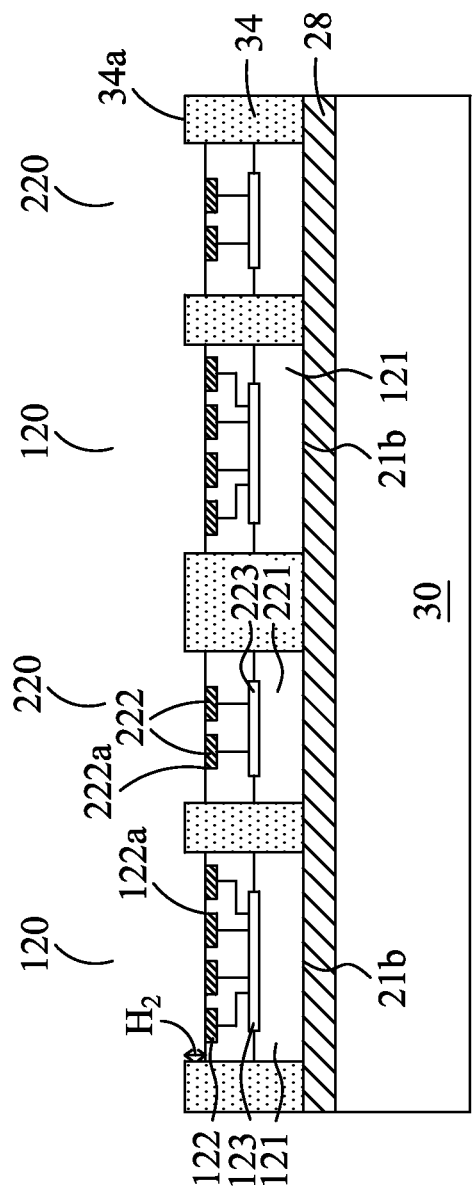

Next, as shown in FIG. 5, the planarization stop layers 125 and 225 are removed, in accordance with some embodiments. Layers 125, 225 may be removed by various methods, such as by an etching process, which can be a dry process or a wet process, or by peeling. For example, layers 125 and/or 225 may be made of a ultra-violet (UV) tape, which becomes non-adhesive to a surface after being exposed to a UV light. After the UV light exposure, layers 125 and/or 225 may be peeled off the surface of substrate 30. If layers 125 and/or 225 are fluidic, layers 125 and/or 225 are removed by chemical solvent, in some embodiments.

With the removal of planarization stop layers 125 and 225, the surfaces 122a and 222a of conductive pads 122 and 222, respectively, are lower than the surface 34a of molding compound 34, as shown in FIG. 5, in accordance with some embodiments. In some embodiments, the difference in height, $H_2$, is in a range from about 5 m to about 100 m.

Figure 6:
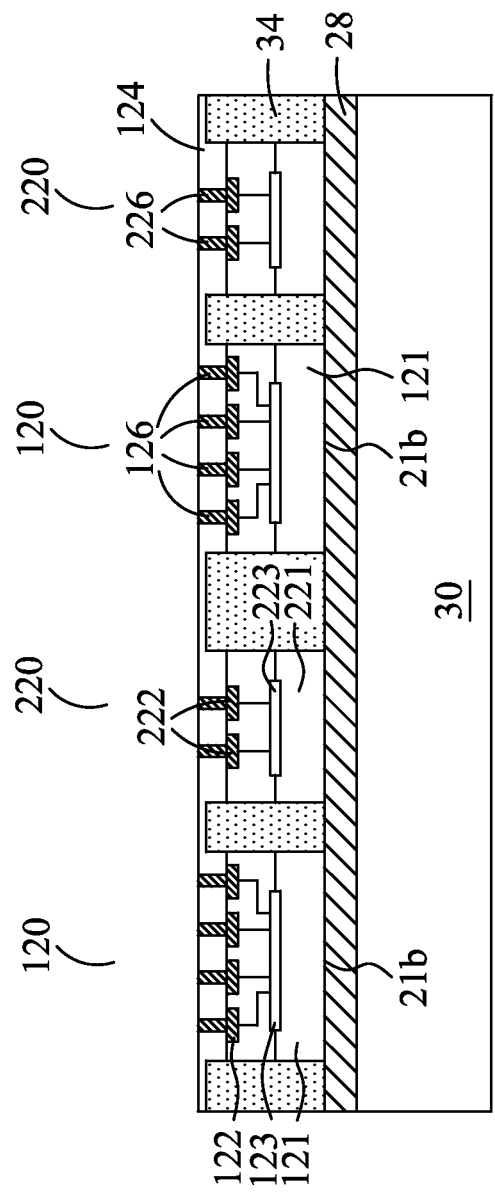

Afterwards, as shown in FIG. 6, conductive plugs 126 and 226 are formed over conductive pads 122 and 222, respectively, in accordance with some embodiments. To form the conductive plugs 126 and 226, a dielectric layer 124 is formed to fill into the space previously occupied by layers 125 and 225, in accordance with some embodiments. In some embodiments, the dielectric layer 124 extends over molding compound 34. The material of dielectric layer 24 may be selected from photo-definable solder resists, a polymer such as polyimide, polybenzoxazole (PBO), benzocyclobutene (BCB), molding compound, and the like. The material of dielectric layer 124 may be soft for absorbing the stress of the ball mount process, which will be described below. The dielectric layer 124 is then patterned to form the plug openings of conductive plugs 126 and 226, in some embodiments. The plug openings are then filled with a conductive material to form conductive plugs 126 and 226. In some embodiments, the filling of the plug openings involves plating a metal, such as copper, and removing excess metal outside the plug openings, such as by a chemical-mechanical polising (CMP) process.

The process flow described above uses the planarization stop layer(s) 125 or/and 225 to determine the end-point of the planarization process performed on the molding compound 34. In some wafer-level packaging (WLP) technologies, copper plugs (or pillars) are formed in a dielectric layer on wafers prior to sawing the dies. Such copper plugs can be used as planarization stops.

Figure 7:
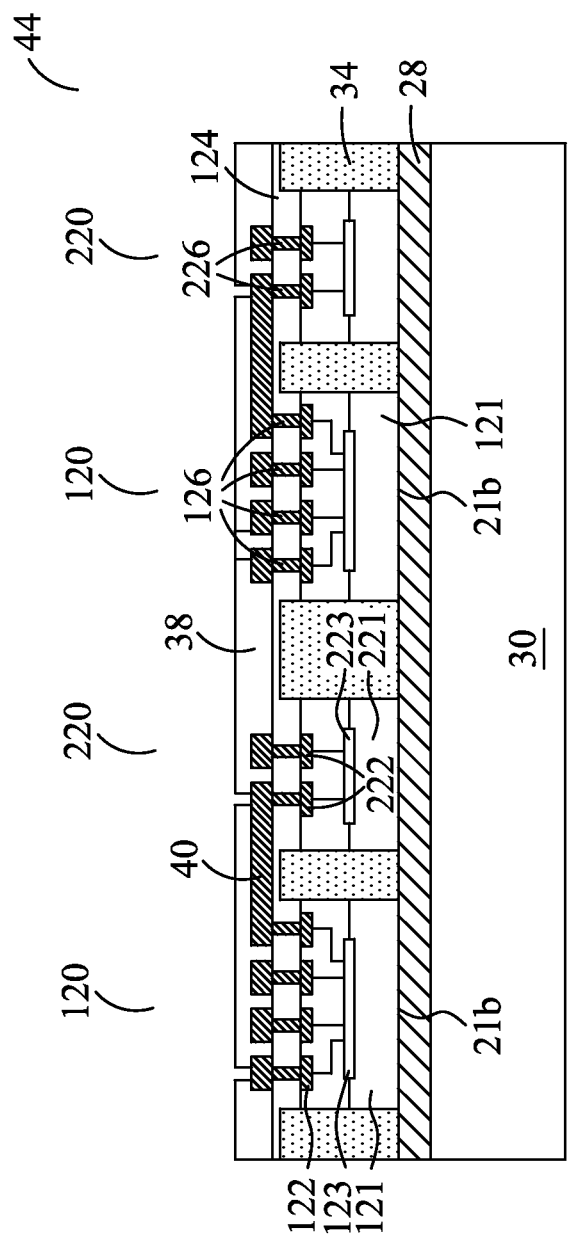

Redistribution lines (RDLs) 40 are then formed over dies 120 and 220, and are connected to conductive plugs 126 and 226, as shown in FIG. 7 in accordance with some embodiments. The formation of RDL 40 involves depositing a conductive layer, by a method such as Physical Vapor Deposition (PVD), patterning the conductive layer, and etching the conductive layer, in accordance with some embodiments. Afterwards, a dielectric layer 38 is formed over RDLs 40 to cover portions of RCLs 40 and leave the remaining portions exposed. The material of dielectric layer 38 may be selected from photodefinable solder resists, a polymer such as polyimide, polybenzoxazole (PBO), benzocyclobutene (BCB), molding compound, and the like. The material of dielectric layer 124 may be soft for absorbing the stress of the ball mount process, which will be described below.

In some alternative embodiments, the formation methods of RDLs 40 include damascene processes. RDLs 40 may be formed in dielectric layer(s) 38, and may include metal lines and vias. In some embodiments, RDLs 40 extend beyond edges of the respective dies 120 and 220 and overlapping the portions of molding compound 34 that are filled between dies 120 and 220. Accordingly, the resulting package is a fan-out package. In some embodiments, RDLs 40 include copper and/or copper alloy, in some embodiments. RDLs 40 may also include copper barrier layer to separate copper in the RDLs 40 from directly contacting the surrounding dielectric layer(s).

Figure 8:
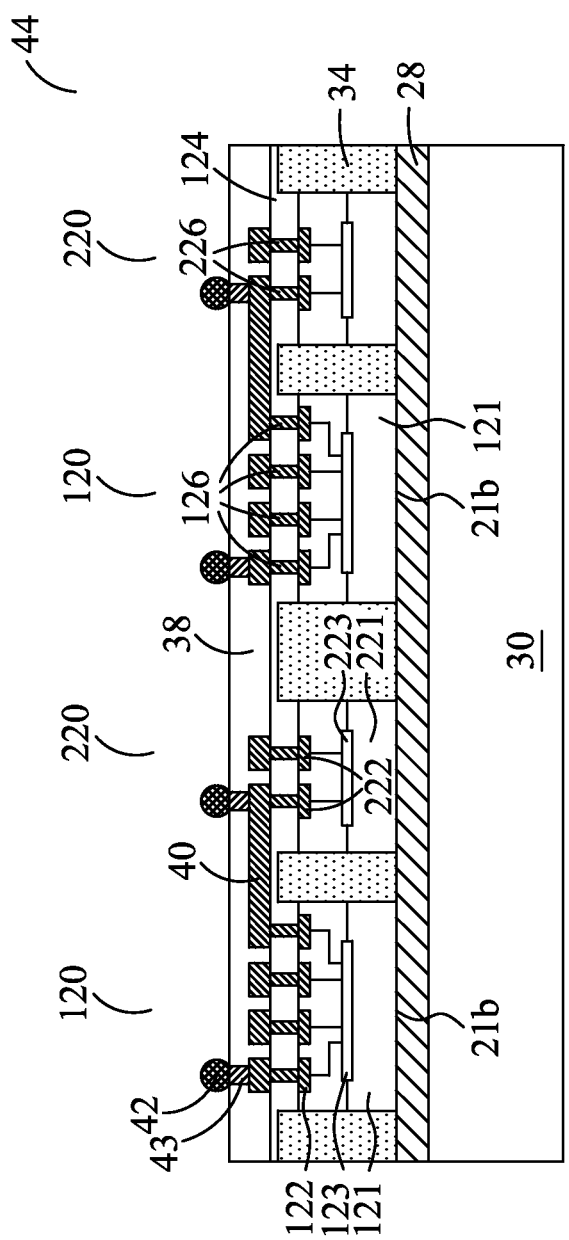

FIG. 8 illustrates the formation of electrical connectors 42, which are electrically coupled to RDLs 40, in accordance with some embodiments. As a result, electrical connectors 42 are located on the top surface of the newly formed wafer 44 (exposed surfaces of RDLs 40). Electrical connectors 42 may be solder balls that are transferred onto wafer 44 using a ball-mounting head (not shown). In some alternative embodiments, electrical connectors 42 may include copper bumps (or copper pillars). In some embodiment, an under bump metallization (UBM) layer 43 is formed between RDLs 40 and such electrical connectors 42. The UBM layer 43 could include sub-layers. For example, if RDLs 40 are made of aluminum, an UBM layer 43 having a Ti sub-layer (a diffusion barrier) and a Cu sub-layer (a seed layer) may be used. The Ti sub-layer acts as a barrier layer and the Cu sub-layer acts as a seed layer for plating the copper bumps (as connectors 42).

Some of electrical connectors 42 may be formed over and aligned to dies 120 and 220, while some other electrical connectors 42 may also be formed over and aligned to molding compound 34, and aligned to the spaces between dies 120 and 220. Forming electrical connectors 42 outside the boundaries of die 120 and 220 is enabled by RDLs 40. As mentioned above, connections beyond the boundaries of dies are part of a fan-out package.

Figure 9:
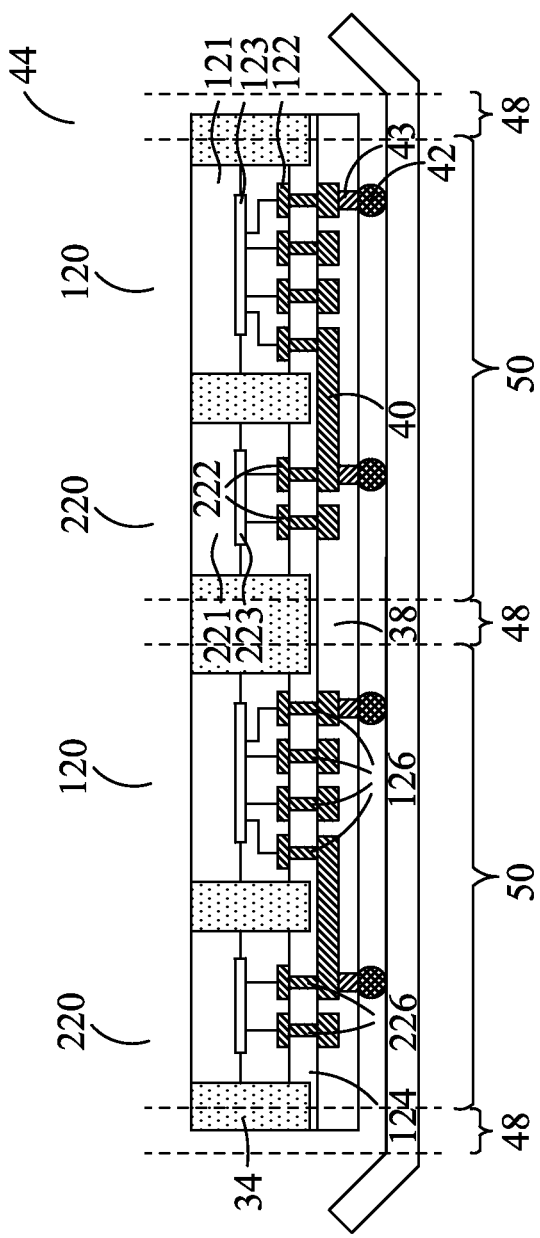

Next, as shown in FIG. 9, carrier 30 is demounted from wafer 44, and adhesive layer 28 may also be removed, leaving wafer 44, in accordance with some embodiments. Wafer 44 may then be attached onto tape 46, and sawed apart along scribe lines 48. Accordingly, packages 50 are formed.

Figure 10:
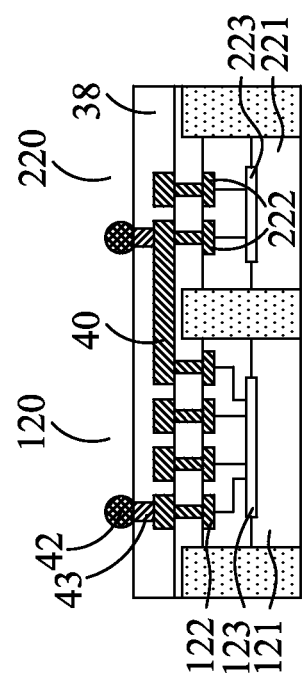

FIG. 10 illustrates one of exemplary packages 50. It is appreciated that in each of packages 50, the bottom surface 120b of die 120 and bottom surface 220b of die 220 are substantially level with bottom surface 34b of molding compound 34. Furthermore, bottom surface 120b of die 120 may also be the bottom surface 121b of substrate 121, and bottom surface 220b of die 220 may also be the bottom surface 221b of substrate 221. Accordingly, the bottom surface 121b of substrate 121 and bottom surface 221b of substrate 221 are level with bottom surface 34b of molding compound 34. On the top side, RDLs 40 are formed over, and connected to, Conductive plugs 126 and 226. Furthermore, RDLs 40 may extend over the portion of molding compound 34 that fills the spaces between dies 120 and 220. Accordingly, package 50 is a fan out package.

Figure 11:
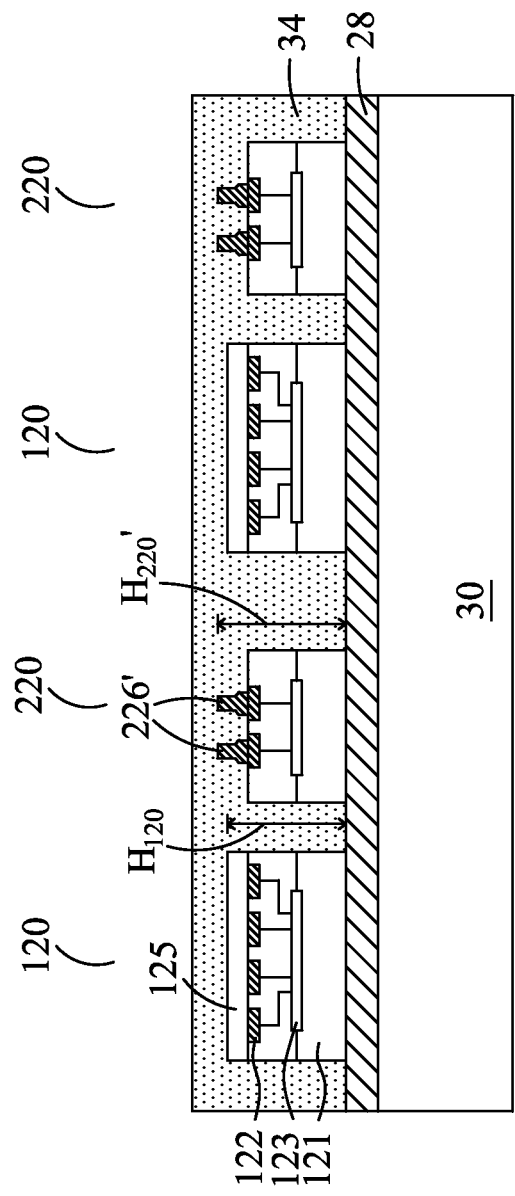
FIG. 11 is a cross-sectional view of dies with stud bumps on a substrate, in accordance with some embodiments.

FIGS. 1 through 10 illustrate the formation of package 50, which includes dies 120 and 220 that are different from each other, in accordance with some embodiments. In some embodiments, dies 120 ad 220 are identical. In some alternative embodiments, a plurality of dies 220' is placed on adhesive 28, as shown in FIG. 11. Stud bumps 226' are then formed over dies 220. In some embodiments, the stud bumps 226' are formed on dies 220 before dies 220 are placed on adhesive layer 28. Stud bumps 226' may be made of aluminum, copper, gold, solder, alloy thereof, or a combination thereof. Dies 220' are not covered by a planarization layer, in accordance with some embodiments. As shown in FIG. 11, molding compound 34 is applied to cover dies 120 and 220'. The total height $H_{120}$ of dies 120 with the planarization stop layer 125 is lower than the total height $H_{220'}$ of dies 220', in accordance with some embodiments. The stud bumps 226' are used as planarization stops (for the determination of the endpoint of the planarization process). After the top surface of stud bumps 226' are reached, additional planarization with a fixed time can be used to expose the top surfaces of planarization stop layer 125, in some embodiments. In some alternative embodiments, $H_{120}$ is higher than $H_{220'}$, and planarization stop layer 125 is used for the determination of the endpoint of the planarization operation. After the top surface of planarization stop layer 125 is reached, additional planarization with a fixed time is used to expose the top surfaces of stud bumps 226', in accordance with some embodiments.

Figure 12:
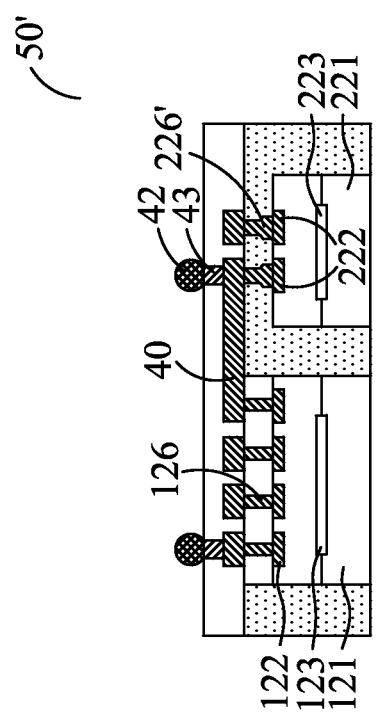
FIG. 12 is a cross-sectional view of a package, in accordance with some embodiments.

The following processing operations to complete formation of packages 50', as shown in FIG. 12 in accordance with some embodiments, are similar to those described in FIGS. 3-10, with the exception that stud bumps 226' replace conductive plugs 226.

The embodiments described above include two dies in each package. However, the packaging mechanisms described above may apply to packaging various combinations of dies. For example, there could be only one die in each package. In some alternative embodiments, three or more dies may be included in a package.

The embodiments of mechanisms of wafer-level packaging (WLP) described above utilize a planarization stop layer to indicate an end-point of the removal of excess molding compound prior to formation of redistribution lines (RDLs). Such mechanisms of WLP enable fan-out and multi-chip packaging. The mechanisms also enable chips (or dies) with different types of external connections to be packaged together. For example, a die with pre-formed bumps can be packaged with a die without pre-formed bumps.

One aspect of this description relates to a semiconductor package. The semiconductor package includes a first semiconductor die surrounded by a molding compound. The semiconductor package further includes a first conductive pad on the first semiconductor die, wherein the first conductive pad is at a top metal level of the first semiconductor die. The semiconductor package further includes redistribution lines (RDLs) formed over the first conductive pad, wherein at least one RDL of the RDLs extends beyond the boundaries of the semiconductor die, and a portion of the at least one RDL contacts the first conductive pad, wherein a surface of the first conductive pad contacting the portion of the at least one RDL is at a different level than a surface of the molding compound under the at least one RDL extended beyond the boundaries of the first semiconductor die.

Another aspect of this description relates to a semiconductor package. The semiconductor package includes a molding compound surrounding a first semiconductor die, and a first conductive pad on the first semiconductor die, wherein the first conductive pad is at a top metal level of the first semiconductor die. The semiconductor package further includes a redistribution line (RDL) over the first conductive pad, wherein the RDL extends over a top surface of the molding compound, and a portion of the RDL is electrically connected to the first conductive pad, and a surface of the first conductive pad electrically connected to the portion of the RDL is at a different level from the top surface of the molding compound.

Still another aspect of this description relates to a semiconductor package. The semiconductor package includes a first semiconductor die, and a second semiconductor die spaced from the first semiconductor die. The semiconductor package further includes a first conductive pad on the first semiconductor die, and a second conductive pad on the second semiconductor die. The semiconductor package further includes a dielectric layer surrounding the first semiconductor die and the second semiconductor die. The semiconductor package further includes a redistribution line (RDL) electrically connected to the first conductive pad and to the second conductive pad, wherein the RDL extends over a top surface of the dielectric layer, and a surface of the first conductive pad electrically connected to the portion of the RDL is at a different level from the top surface of the dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor package comprising:
    a first semiconductor die surrounded by a molding compound that extends from an outer sidewall of the first semiconductor die to an outermost sidewall of the semiconductor package, the first semiconductor die comprising a semiconductor substrate having an active upper surface on which semiconductor devices are arranged and an inactive lower surface opposite the active upper surface, the inactive lower surface being devoid of semiconductor devices and being devoid of conductive interconnect structures under the inactive lower surface;
    a first conductive pad on an upper surface of the first semiconductor die, wherein the first conductive pad is at a top metal level of the first semiconductor die;
    redistribution lines (RDLs) formed over the first conductive pad and within a dielectric layer, wherein at least one RDL of the RDLs extends beyond boundaries of the first semiconductor die, and a portion of the at least one RDL is electrically connected to the first conductive pad;
    wherein the first semiconductor die is recessed below an upper surface of the molding compound that faces the RDLs;
    an under bump metallization (UBM) layer comprising a linear sidewall and extending from an upper surface of the at least one RDL to an upper surface of the dielectric layer;
    a solder bump arranged over the UBM layer; and
    a conductive plug surrounded by a single dielectric layer, wherein the single dielectric layer laterally contacts the molding compound and vertically contacts the RDL, the molding compound, and the first conductive pad, and wherein the dielectric layer has a bottommost surface that is above a topmost surface of the single dielectric layer; and
    wherein the inactive lower surface of the semiconductor substrate is opposite the solder bump and is co-planar with a lower surface of the molding compound opposite the solder bump, and wherein the molding compound is a continuous structure extending vertically from the single dielectric to the inactive lower surface and extending laterally from the outer sidewall of the first semiconductor die to an outermost sidewall of the semiconductor package without the RDLs, the UBM layer, the conductive plugs, or any other conductive structure passing though the continuous structure of the molding compound.

2. The semiconductor package of claim 1, wherein the conductive plug has a bottom surface that directly contacts the first conductive pad at a first position directly below a second position at which a top surface of the conductive plug contacts the at least one RDL, and wherein the at least one RDL continuously extends over the top surface of the conductive plug and beyond opposing sidewalls of the conductive plug.

3. The semiconductor package of claim 2, wherein the RDL comprises a barrier layer that separates a metal within the RDL from the single dielectric layer and the dielectric layer.

4. The semiconductor package of claim 3, wherein the dielectric layer is separated from the molding compound by the single dielectric layer.

5. The semiconductor package of claim 3, further comprising:
    a second semiconductor die, wherein the first semiconductor die and the second semiconductor die extend from the dielectric layer though the molding compound, which is laterally between the first semiconductor die and the second semiconductor die.

6. The semiconductor package of claim 2,
    wherein the first conductive pad has outermost sidewalls that are arranged within the single dielectric layer underlying the dielectric layer and that are directly coupled to a top surface of the first conductive pad, which contacts the bottom surface of the conductive plug; and
    wherein the conductive plug comprises linear sidewalls coupled to the bottom surface of the conductive plug.

7. The semiconductor package of claim 1, wherein a difference in height between an upper surface of the first conductive pad and the upper surface of the molding compound is in a range from about 5 um to about 100 um.

8. The semiconductor package of claim 1, wherein the upper surface of the molding compound is substantially flat.

9. The semiconductor package of claim 1, wherein the first conductive pad is arranged within one or more dielectric layers that are below the upper surface of the molding compound.

10. The semiconductor package of claim 1, wherein the first conductive pad is arranged completely below the upper surface of the molding compound.

11. The semiconductor package of claim 1, wherein the inactive lower surface, the lower surface of the molding compound, and the solder bump are each exposed to an ambient environment surrounding the semiconductor package.

12. A semiconductor package comprising:
a molding compound surrounding a first semiconductor die, the first semiconductor die comprising a semiconductor substrate having an active upper surface on which semiconductor devices are arranged and an inactive lower surface opposite the active upper surface, the inactive lower surface being devoid of semiconductor devices and being devoid of conductive interconnect structures under the inactive lower surface, wherein the inactive lower surface of the semiconductor substrate is co-planar with a lower surface of the molding compound;
a first conductive pad on the first semiconductor die, wherein the first conductive pad is at a top metal level of the first semiconductor die;
a redistribution line (RDL) extending over a top surface of the molding compound, wherein a portion of the RDL is electrically connected to the first conductive pad by a conductive plug arranged within a single dielectric layer, wherein the single dielectric layer laterally contacts the molding compound and vertically contacts the RDL, the molding compound, and the first conductive pad, and wherein the RDL continuously extends over a top surface of the conductive plug from beyond a first sidewall of the conductive plug to beyond a second sidewall of the conductive plug opposing the first sidewall;
wherein the conductive plug directly contacts the first conductive pad, which is below a bottom of the single dielectric layer;
wherein the RDL is arranged within a second dielectric layer that has a bottommost surface that is above a topmost surface of the single dielectric layer; and
wherein the molding compound is a continuous structure from the single dielectric to the inactive lower surface without the RDLs, the UBM layer, the conductive plugs or any other conductive structure passing though the molding compound.

13. The semiconductor package of claim 12, further comprising a second semiconductor die spaced from the first semiconductor die, the second semiconductor die surrounded by the molding compound, wherein the RDL is electrically connected to the second semiconductor die.

14. The semiconductor package of claim 12, further comprising an electrical connector electrically connected to the RDL, wherein the electrical connector is located outside a boundary of the first semiconductor die.

15. The semiconductor package of claim 12, wherein the first semiconductor die is recessed below the top surface of the molding compound facing the RDL.

16. The semiconductor package of claim 15, wherein the first conductive pad is arranged completely below the top surface of the molding compound.

17. A semiconductor package comprising:
a first semiconductor die, the first semiconductor die comprising a first semiconductor substrate having a first active upper surface on which devices are arranged and a first inactive lower surface opposite the first active upper surface, the inactive lower surface being devoid of semiconductor devices and being devoid of conductive interconnect structures under the inactive lower surface;
a second semiconductor die spaced from the first semiconductor die, the second semiconductor die comprising a second semiconductor substrate having a second active upper surface on which devices are arranged and a second inactive lower surface opposite the second active upper surface;
a first conductive pad on the first semiconductor die;
a second conductive pad on the second semiconductor die, wherein the first conductive pad and the second conductive pad are laterally separated by a molding compound;
a redistribution line (RDL) electrically connected to the first conductive pad and to the second conductive pad, wherein the RDL extends over a top surface of the molding compound and is arranged within a dielectric layer;
a conductive plug arranged between the first conductive pad and the RDL, wherein the RDL extends as a continuous structure from over a top of the conductive plug past opposing outermost linear sidewalls of the conductive plug, wherein the conductive plug is comprised within a single dielectric layer that continuously extends from a top surface of the first semiconductor die to a lower surface of the RDL facing the first semiconductor die, and wherein the dielectric layer that has a bottommost surface that is above a topmost surface of the single dielectric layer; and
wherein each of the first inactive lower surface, the second inactive lower surface, and a bottom surface of the molding compound are co-planar and wherein no conductive structures, including the RDLs, the UBM layer, and the conductive plugs, pass though any portion of the molding compound.

18. The semiconductor package of claim 17, further comprising an electrical connector electrically connected to the RDL, wherein the electrical connector is over the top surface of the molding compound and located outside a boundary of the first semiconductor die.

19. The semiconductor package of claim 17, further comprising:
a conductive plug arranged within the single dielectric layer, wherein the conductive plug has a bottom surface that directly contacts the first conductive pad at a first position directly below a second position at which a top surface of the conductive plug contacts the RDL, and wherein the RDL extends over the top surface of the conductive plug and beyond opposing sidewalls of the conductive plug.

20. The semiconductor package of claim 17, wherein each of the first inactive lower surface, the second inactive lower surface, and a bottom surface of the molding compound are exposed to an ambient environment surrounding the semiconductor package.

* * * * *